United States Patent [19]
Murray et al.

[11] Patent Number: 6,162,987
[45] Date of Patent: Dec. 19, 2000

[54] MONOLITHIC INTERCONNECTED MODULE WITH A TUNNEL JUNCTION FOR ENHANCED ELECTRICAL AND OPTICAL PERFORMANCE

[75] Inventors: Christopher S. Murray, Bethel Park, Pa.; David M. Wilt, Bay Village, Ohio

[73] Assignee: The United States of America as represented by the United States Department of Energy, Washington, D.C.

[21] Appl. No.: 09/343,538

[22] Filed: Jun. 30, 1999

[51] Int. Cl.$^7$ ................................... H01L 31/00
[52] U.S. Cl. ......................... 136/253; 136/249; 136/255
[58] Field of Search .................. 136/253, 249, 136/255

[56] References Cited

U.S. PATENT DOCUMENTS

| | | | |
|---|---|---|---|
| 4,746,370 | 5/1988 | Woolf ...................................... | 136/253 |
| 5,322,573 | 6/1994 | Jain et al. .............................. | 136/252 |
| 5,407,491 | 4/1995 | Freundlich et al. .................... | 136/249 |
| 5,753,050 | 5/1998 | Charache et al. ...................... | 136/255 |
| 5,800,630 | 9/1998 | Vilela et al. ............................ | 136/249 |

OTHER PUBLICATIONS

Wilt, David M. et al., Monolithically Interconnected InGaAs TPV Module Development, IEEE 25th PVSC, 1996, pp. 43–48.

Wilt, David M. et al., n/p/n Tunnel Junction In GaAs Monolithic Interconnected Module (MIM), The Fourth NREL Conference on Thermophotovoltaic Generation of Electricity, Oct. 11–15, 1998, Denver, CO.

Borden, 14th IEEE Photovoltaic Specialists Conference, p. 554 (1980).

McCelland et al., 21st IEEE Photovoltaics Specialists Conference, p. 168 (1990).

Rand et al., AIP Conference Proc. 52 (1992), pp. 52–57.

Spitzer et al., 22nd IEEE Photovoltaics Specialists Conference, p. 142 (1991).

Wilt et al., Proc. 3rd NREL Conf. On TPV Gen. Of Elect, p. 237, AIP 401 (1997).

Ward et al., Proc. 3rd NREL Conf. On TPC Gen. Of Elect, p. 227, AIP 401 (1997).

*Primary Examiner*—Mark Chapman
*Attorney, Agent, or Firm*—Virginia B. Caress; William R. Moser; Paul A. Gottlieb

[57] ABSTRACT

An improved thermophotovoltaic (TPV) n/p/n device is provided. Monolithic Interconnected Modules (MIMS), semiconductor devices converting infrared radiation to electricity, have been developed with improved electrical and optical performance. The structure is an n-type emitter on a p-type base with an n-type lateral conduction layer. The incorporation of a tunnel junction and the reduction in the amount of p-type material used results in negligible parasitic absorption, decreased series resistance, increased voltage and increased active area. The novel use of a tunnel junction results in the potential for a TPV device with efficiency greater than 24%.

21 Claims, 7 Drawing Sheets

MIM WITH AN n/p/n CELL ARCHITECTURE
AND BURIED TUNNEL JUNCTION

| | |
|---|---|
| 0.1 μm n-In$_x$Ga$_{1-x}$ As Contact Layer, 3E19 cm$^{-3}$ | (10) |
| 0.1 μm n-InP or n-InP$_y$As$_{1-y}$* Window, 2E18 cm$^{-3}$ | (12) |
| 0.3 μm n-In$_x$Ga$_{1-x}$ As Emitter, 1E18 cm$^{-3}$ | (14) |
| 1.5 μm p-In$_x$Ga$_{1-x}$ As Base, 6E17 cm$^{-3}$ | (16) |
| 0.05 μm p-InP or n-InP$_y$As$_{1-y}$* Back Surface Field, 3E18 cm$^{-3}$ | (18) |
| 0.02 μm p-In$_x$Ga$_{1-x}$ As Tunnel Junction, 3E19 cm$^{-3}$ | (20) |
| 0.02 μm n-In$_x$Ga$_{1-x}$ As Tunnel Junction, 3E19 cm$^{-3}$ | (22) |
| 0.10 μm n-InP or n-InP$_y$As$_{1-y}$* Etch Stop, 1E18 cm$^{-3}$ | (23) |
| 0.2–3 μm n-In$_x$Ga$_{1-x}$ As Lateral Conduction Layer, 3E19 cm$^{-3}$ –1E18 cm$^{-3}$ | (24) |
| 0–5 μm In$_x$Ga$_{1-x}$ As or InP$_y$As$_{1-y}$ Buffer Layers*, Undoped | (25) |
| Semi-Insulating InP(Fe) Substrate | (26) |
| MgF$_2$/Au Back Surface Reflector | (28) |

* Used for lattice mismatched material
Invention

PROTOTYPIC p/n MIM WITH TYPICAL VALUES OF
LAYER THICKNESSES AND DOPING LEVELS.

---

0.1 μm p-$In_xGa_{1-x}$As Contact Layer, 5E18-2E19 $cm^{-3}$

---

0.1 μm p-InP or p-$InP_yAs_{1-y}$* Window, 2E18 $cm^{-3}$

---

0.1-0.3 μm p-$In_xGa_{1-x}$As Emitter, 5E18-2E19 $cm^{-3}$

---

1.5-3 μm n-$In_xGa_{1-x}$As Base, 5E16-5E17 $cm^{-3}$

---

0.1 μm n-InP or n-$InP_yAs_{1-y}$* Back Surface Field, 3E18 $cm^{-3}$

---

0.2-3 μm n-$In_xGa_{1-x}$As Lateral Conduction Layer, 1E18-3E19 $cm^{-3}$

---

0-5 μm $In_xGa_{1-x}$As or $InP_yAs_{1-y}$ Buffer Layers*, Undoped

---

Semi-Insulating InP(Fe) Substrate

---

$MgF_2$/Au Back Surface IR Reflector

---

* Used for lattice mismatched material

FIG. 1
PRIOR ART

MIM WITH AN n/p/n CELL ARCHITECTURE AND BURIED TUNNEL JUNCTION

| | |
|---|---|
| 0.1 μm n-In$_x$Ga$_{1-x}$ As Contact Layer, 3E19 cm$^{-3}$ | (10) |
| 0.1 μm n-InP or n-InP$_y$As$_{1-y}$* Window, 2E18 cm$^{-3}$ | (12) |
| 0.3 μm n-In$_x$Ga$_{1-x}$ As Emitter, 1E18 cm$^{-3}$ | (14) |
| 1.5 μm p-In$_x$Ga$_{1-x}$ As Base, 6E17 cm$^{-3}$ | (16) |
| 0.05 μm p-InP or n-InP$_y$As$_{1-y}$* Back Surface Field, 3E18 cm$^{-3}$ | (18) |
| 0.02 μm p-In$_x$Ga$_{1-x}$ As Tunnel Junction, 3E19 cm$^{-3}$ | (20) |
| 0.02 μm n-In$_x$Ga$_{1-x}$ As Tunnel Junction, 3E19 cm$^{-3}$ | (22) |
| 0.10 μm n-InP or n-InP$_y$As$_{1-y}$* Etch Stop, 1E18 cm$^{-3}$ | (23) |
| 0.2-3 μm n-In$_x$Ga$_{1-x}$ As Lateral Conduction Layer, 3E19 cm$^{-3}$ -1E18 cm$^{-3}$ | (24) |
| 0-5 μm In$_x$Ga$_{1-x}$ As or InP$_y$As$_{1-y}$ Buffer Layers*, Undoped | (25) |
| Semi-Insulating InP(Fe) Substrate | (26) |
| MgF$_2$/Au Back Surface Reflector | (28) |

* Used for lattice mismatched material

Invention

FIG. 4

MONOLITHIC INTERCONNECTED MODULE WITH A TUNNEL JUNCTION FOR ENHANCED ELECTRICAL AND OPTICAL PERFORMANCE

The Government has rights in this invention pursuant to a contract awarded by the Department of Energy.

BACKGROUND OF THE INVENTION

1. Field of the Invention

This invention relates to the field of thermophotovoltaic (TPV) direct energy conversion. In particular, the present invention relates to a high voltage, low current device called a monolithic interconnected module and a design for improving the power density and conversion efficiency.

2. Background of the Invention

Thermophotovoltaics (TPV) is a direct energy conversion technology that utilizes the infrared radiation emitted from a hot metal or ceramic radiator for conversion into electricity through absorption in a semiconductor photovoltaic device. A TPV system consists of several components: 1) energy source (e.g. combustion, solar concentrator, etc.), 2) radiator (e.g. high temperature metal or ceramic), 3) spectral control (e.g. anti-reflection coating, front surface filter or back surface reflector) and 4) photovoltaic device (e.g. single junction or monolithic interconnected module (MIM)). This invention is the improvement of the MIM device that combines the spectral control and photovoltaic device functions into a single device, resulting in increased power density and efficiency.

A MIM consists of multiple series interconnected cells on a common semi-insulating substrate that results in a higher voltage and lower current device and incorporates a back surface reflector for optical recuperation. Monolithic modules (or high voltage devices) have been investigated for many years for solar photovoltaic power production and as a means of reducing internal joule heating losses by reducing the current, simplifying array fabrication and improving array reliability. Results of these investigations are described in Borden, 14th IEEE Photovoltaic Specialists Conference, p. 554 (1980), McClelland et al., 21st IEEE Photovoltaics Specialists Conference, p. 554 (1990), Rand et al., AIP Conference Proc. 52 (1992), and Spitzer et al., 22nd IEEE Photovoltaics Specialists Conference, p. 142 (1991). These devices were grown from materials such as silicon (Si, energy bandgap of 1.1 eV) and gallium arsenide (GaAs, energy bandgap of 1.4 eV) and used the sun as the source of light for conversion into electricity.

More recently, MIMs have been grown from indium gallium arsenide (InGaAs, energy bandgaps ranging from 0.5 eV to 0.75 eV). The smaller bandgaps enable indium gallium arsenide-based devices to respond to energy with a longer wavelength than visible light, such as that emitted by a hot metal radiator. These devices employ a back surface reflector to recover radiation that is initially non-convertible. The back surface reflector is placed behind the device, directing above-bandgap energy through the cell for a second time for absorption in the active region. By using an n-doped substrate (typically indium phosphide), absorption in the substrate outside the active region can be reduced but not eliminated, as was demonstrated for conventional (non-MIM) thermophotovoltaic devices, integrated into an array using conventional solar cell interconnection technology, in U.S. Pat. No. 5,753,050 by Charache et al.

Combining the monolithic module and BSR (back surface reflector) technologies optimizes device performance. The substrate used in the MIM is semi-insulating and does not absorb non-convertible radiation. FIG. 1 is a schematic of a typical prior art MIM design with a p/n cell architecture. A p-doped emitter with an n-doped base cell architecture is traditionally chosen for the MIM to minimize electrical and optical losses. The two layers that make the greatest contributions to these losses are the p-doped InGaAs emitter and n-doped InGaAs lateral conduction layer (LCL). Measurements have indicated that p-type material has 20 times higher free carrier absorption than equivalently doped n-type material. Therefore, minimizing the thickness of p-doped material maximizes device efficiency. A trade-off between free carrier absorption, sheet resistance and active device area for, the p-doped emitter dictates that the emitter thickness be on the order of 0.3 $\mu$m. However, recent calculations suggest that the maximum efficiency obtainable with a 0.3 $\mu$m thick p-doped emitter is approximately 15%; therefore, this layer thickness has been reduced to 0.1 $\mu$m which increases the device efficiency to 18%. As the radiator temperature is increased or the bandgap of the device is further decreased, the sheet resistance of the emitter layer begins to substantially decrease the electrical performance of the device. Therefore, with a p-doped emitter, both the power density and efficiency are inherently limited.

Two variations of the p/n MIM design have been demonstrated. The conventional MIM, described in Wilt et al., Proc. 3rd NREL Conf. On TPV Gen. Of Elect, pp. 237, AIP 401 (1997), utilizes a thick (typically, >1 $\mu$m), highly doped (typically greater than $10^{19}$ cm$^{-3}$) LCL to conduct the current the entire length of the cell. This type of interconnect scheme is shown in FIG. 2, with the structure of the invention. Alternatively, the interdigitated MIM, described in Ward et al., Proc. 3rd NREL Conf. On TPV Gen. Of Elect, pp. 227, AIP 401 (1997) is able to use a thinner, lower-doped LCL because the current must flow only a short distance to the nearest grid finger. This type of interconnect scheme is shown in FIG. 3, with the structure of the invention. The reduction in LCL thickness and doping level in the interdigitated MIM significantly reduces the optical losses associated with the LCL, but this design does nothing to reduce the losses associated with the p-type emitter.

SUMMARY OF THE INVENTION

In order to minimize optical losses in the MIM and optimize its efficiency, a new device design was invented, the tunnel junction MIM (TJ MIM). This device replaces the p-type emitter of the previous variations with an n-type emitter (i.e., converting to an n/p configuration for the active cell region). A tunnel junction placed at the back of the cell permits the continued use of n-type material for the lateral conduction layer (LCL), thus the only highly doped p-type material in the entire structure is a thin layer in the tunnel junction. It has been demonstrated that p-type tunnel junction layer thicknesses of less than 200 Å are suitable for electrical operation of the cell and contribute negligibly to the optical losses of the device.

The use of the buried tunnel junction and the consequent reduction in p-doped material results in a number of advantages over the existing MIM design. The use of an n-doped emitter decreases the sheet resistance of the emitter by a factor of 25, thus decreasing the overall series resistance of the device. The use of an n-doped emitter also allows for the spacing of the grid fingers to be increased, resulting in an increase in the device active area. An n on p cell architecture has an inherently higher output voltage because of the longer diffusion length of the minority carriers in the p-doped base. The elimination of any highly p-doped layers in the MIM architecture reduces the parasitic absorption of long wavelength light in the device to negligible levels, thus increasing the optical recuperation.

Another embodiment of the device does not require recuperation, but benefits from the tunnel junction MIM architecture. This embodiment is characterized by substrates with band gaps equal to or lower than the device active layers, for example, an InGaP photovoltaic device on the GaAs substrate. The use of the tunnel junction architecture in this embodiment results in a high active area, lower series resistance, and higher open circuit voltage.

BRIEF DESCRIPTION OF THE DRAWINGS

FIG. 1 is a prototypic representation of the layer structure of the prior art, a p/n MIM with typical values of layer thicknesses and doping levels;

FIG. 4 is a representation of the layer structure of the present invention with n/p/n cell architecture and buried tunnel junction;

DETAILED DESCRIPTION OF THE PREFERRED EMBODIMENTS

The MIM is made up of a number of cells electrically connected in series.

Figure 2:
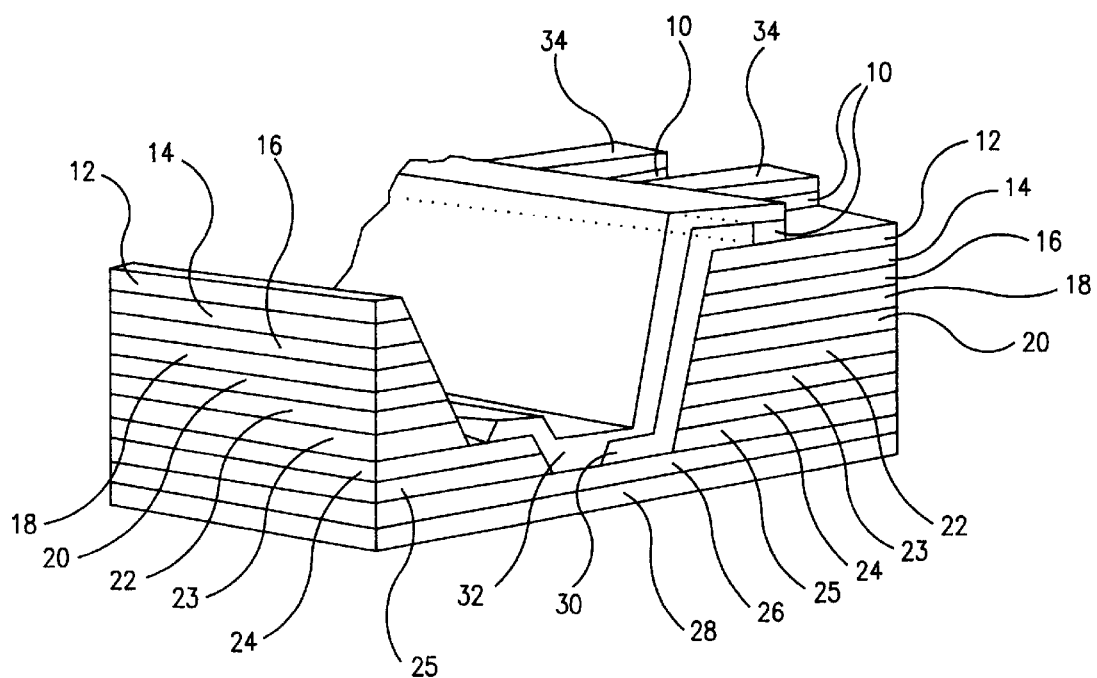
FIG. 2 is a schematic representation of a conventional MIM interconnect with the structure of the invention.

FIG. 2 shows portions of two cells of an invention module using a conventional interconnect metallization grid design, and the electrical connections between them.

n-doped contact layer 10 forms a low-resistance (ohmic) electrical connection between top grid finger 34 above and the n-doped window 12 below.

n-doped window 12 forms an energy barrier that reduces the recombination of electrons and holes where it comes in contact with n-doped emitter 14, located directly below.

Photogenerated carriers are collected at the interface between the n-doped emitter 14 and the p-doped base 16, located directly below emitter 14. The resulting collected electrons move into contact layer 10 and out of the cell, through interconnect 32, to either an adjacent cell or to an external connection. Dielectric layer 30 insulates the interconnect metallization from the exposed active and conducting cell layers.

p-doped back surface field 18, located directly below base 16, prevents the recombination of light-generated carriers.

p-doped tunnel junction component 20, located directly below back surface field 18, and tunnel junction component 22, located directly below tunnel junction component 20, combine to form a tunnel junction that permits current flow from the p-doped back surface field layer 18 to the n-doped lateral conduction layer 24 in the invention.

An n-doped etch stop layer 23, used for control purposes during device fabrication, is located directly below the n-doped tunnel junction component. n-doped lateral conduction layer (LCL) 24, located below the etch stop layer 23, is of a sufficient thickness and doping level to laterally conduct the current.

Undoped buffer layers 25, located below the LCL, are used, if needed, to grade from the lattice constant of the substrate below to that of the active layers above.

Semi-insulating substrate 26, located directly below lateral conduction layer 24 or the undoped buffer layers 25, if present, is the base on which the device is deposited. The substrate material is chosen for electrical isolation and to minimize the absorption of non-convertible light for TPV applications.

Back surface reflector 28, located directly below semi-insulating substrate 26, reflects photons through the active layers of the cell.

Possible substrates for all embodiments include semi-insulating GaAs and semi-insulating InP. If alternative electrical isolation techniques are utilized, the following substrate materials can be used: InSb, InAs, Si, Ge, and GaSb.

Epitaxial layers include the contact layer, the window, the active layers, the tunnel junction layers, the etch stop layer, the lateral conduction layer, and the buffer layers. In FIG. 2, layers 10, 12, 14, 16, 18, 20, 22, 23, 24, and 25 deposited on the substrate, are epitaxial layers. Epitaxial layers may be composed of $In_xGa_{1-x}P_yAs_{1-y}$ for $0 \leq x \leq 1$ and $0 \leq y \leq 1$, $In_xGa_{1-x}As_ySb_{1-y}$ for $0 \leq x \leq 1$ and $0 \leq y \leq 1$, or other III–V compounds.

Materials that may be used for the dielectric layer 30 include spin-on glass, $Si_xN_y$, $Ta_2O_5$, and any ceramic that can be sputtered or e-beamed.

Alloys and elemental depositions of chromium, titanium, silver, and gold may be used as metallization materials.

Figure 3:
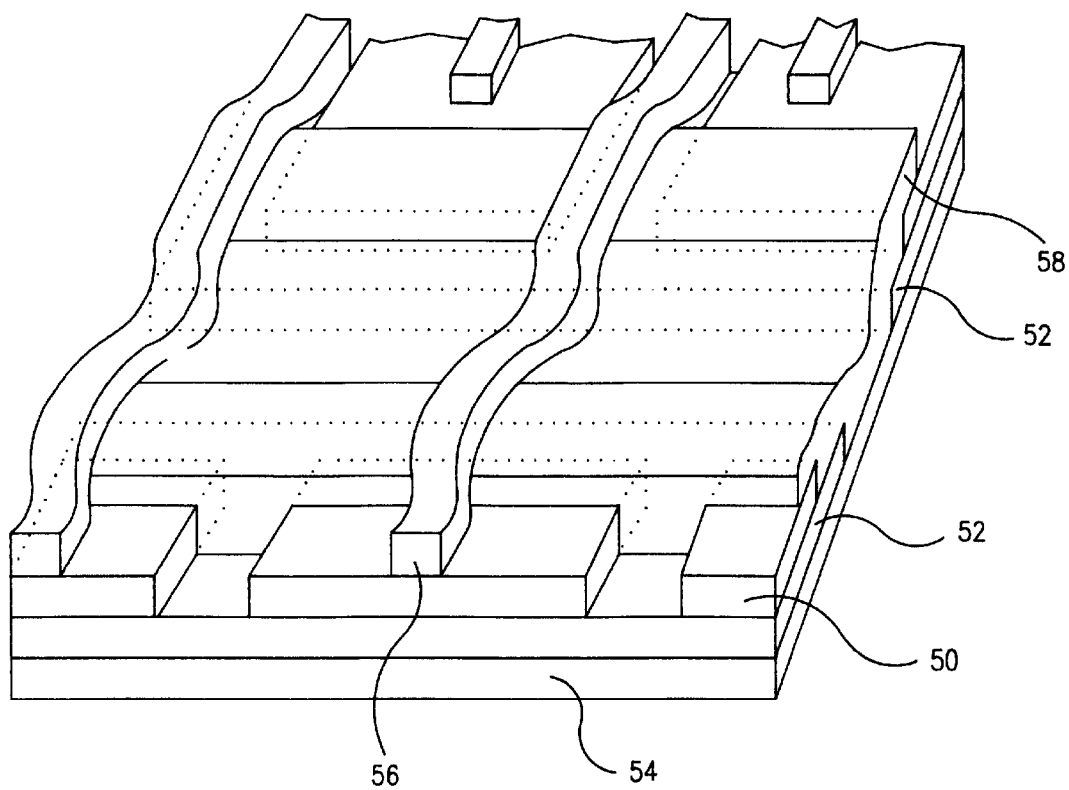
FIG. 3 is a schematic representation of an interdigitated MIM interconnect with the structure of the invention.

FIG. 3 shows portions of two cells of a module of interdigitated interconnect metallization grid design, and the electrical connections between them. Each cell of this module design is made up of two or more subcells connected in parallel fashion. Surface, active and tunnel junction layers 50 define the area of a subcell. Lateral conduction layer 52 defines the area of a cell. The subcells within a cell share a common lateral conduction layer 52 above the substrate 54. The current flows through interconnect 56 to either an adjacent cell or to an external connection. Dielectric layer 58 insulates the interconnect metallization from the exposed active and conducting cell layers.

The subcells are layered InGaAs devices. Surface, active and tunnel junction layers 50 include the following, as illustrated in FIG. 4: a contact layer 10, a window layer 12, emitter and base active layers 14 and 16, a back surface field 18, tunnel junction components 20 and 22, and an etch stop layer 23.

Operation of the TJ MIM has been demonstrated with 0.74 and 0.6 eV InGaAs material using the structure shown in FIG. 4.

Figure 5:
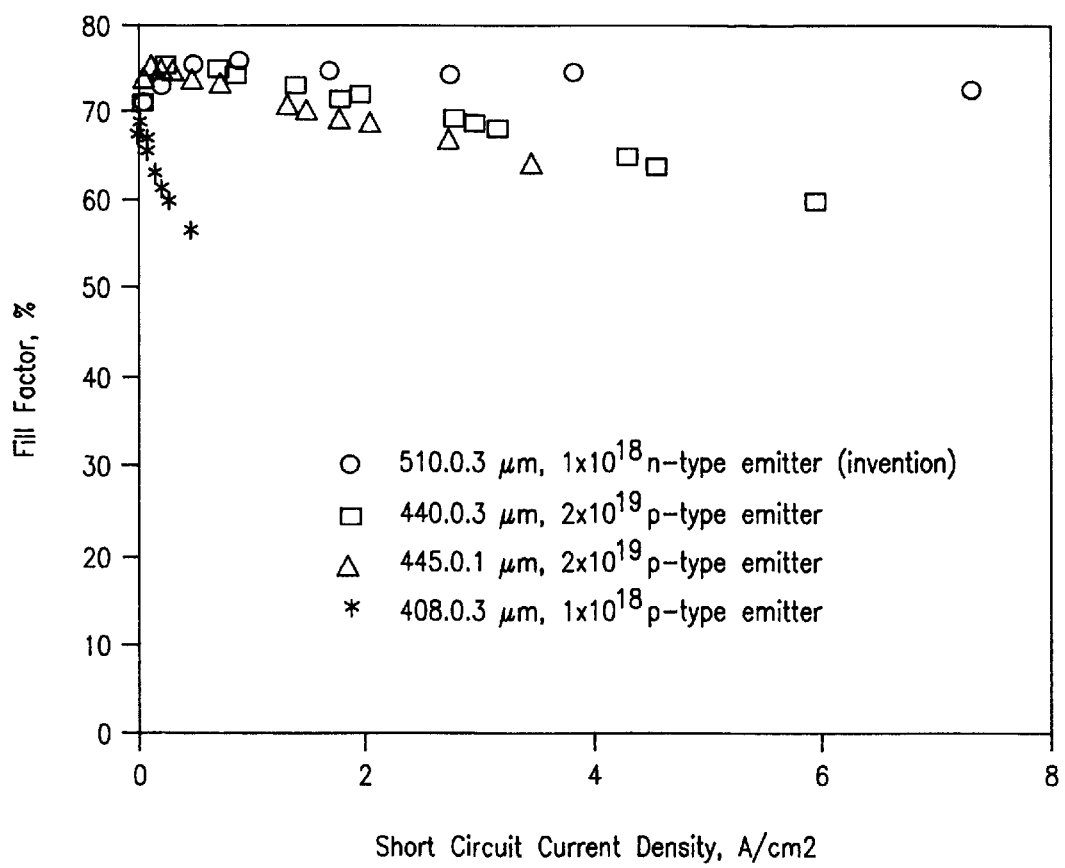
FIG. 5 is a plot of fill factors versus current density for an n/p/n 0.74 eV MIM and various p/n 0.74 eV MIMs.

The fill factor (FF) is the ratio of the actual power of a photovoltaic cell to its power if both current and voltage were at their maxima (i.e., short circuit current and open circuit voltage). It is a key characteristic in evaluating cell performance. FIG. 5 shows the variation of FF with current density for the 0.74 eV structure depicted in FIG. 4 compared to several conventional p/n structures. The n/p/n device (n emitter, p base, n lateral conduction layer) was processed using the standard contact design for p/n MIM devices. All of the devices had the same LCL thickness and doping level. The differences in FF can be attributed to variations in series resistance due to differences in the emitter type, doping level and thickness.

Measurements were taken in a flash simulator with the cell at room temperature. As shown in FIG. 5, there is very little reduction in FF as the current density is increased for the n/p/n device, whereas the p/n structures all show significant degradation with increasing intensity. For operation of this device under a 1200 K radiator, it is expected that the current density would not exceed 0.9 A/cm$^2$. Thus, there is ample opportunity to reduce layer thicknesses, doping levels and grid coverage without sacrificing electrical performance.

Figure 6:
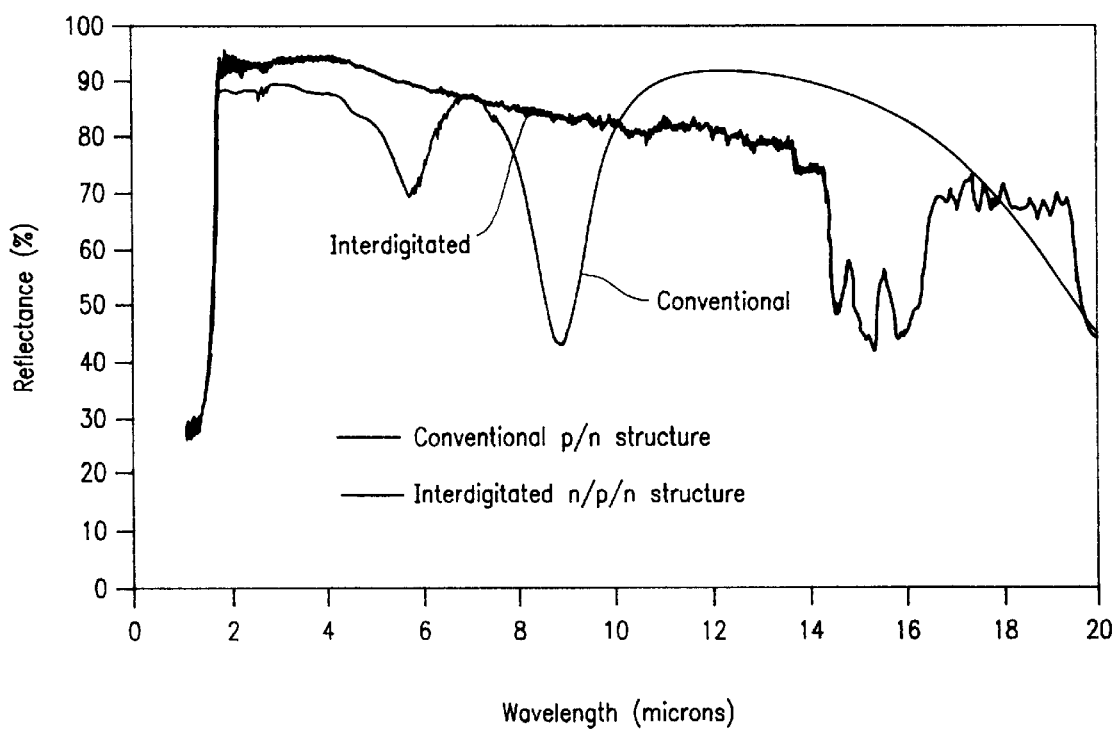
FIG. 6 is a plot of reflectances versus wavelength for conventional p/n and interdigitated n/p/n structures.

FIG. 6 shows the reflectance measurements from an interdigitated n/p/n device structure. For comparison, a conventional p/n MIM structure reflectance is also plotted. There are two features of significance in this figure: the elimination of the plasma absorption peaks at approximately 6 μm and 9 μm and the increase in reflectance in the short wavelength region. The elimination of the plasma peaks can be attributed to the interdigitated cell design and the lower doping level used in the LCL. This feature is not specific to the n/p/n design. The increase in the short wavelength reflectance from ~0.88 to ~0.95 is a direct result of the elimination of the heavily doped p-type emitter through the n/p/n design.

Table 1 lists the short circuit current density $J_{sc}$, fill factor FF, spectral utilization Fu, and the product of FF and Fu for the devices previously described under a variety of blackbody temperatures. The spectral utilization is a ratio of the useful energy absorbed in the emitter and base divided by the total energy absorbed in the device. Also shown is the change in FF*Fu product compared to the n/p/n interdigitated device design. The FF*Fu product captures both the electrical efficiency and optical efficiency of the MIM device in a single, evenly weighted factor. The p/n conventional MIM devices all show significantly lower combined efficiency, particularly at the lower emitter temperatures. The difference between the conventional and interdigitated n/p/n is smaller, particularly at the higher temperature emitters.

Figure 7A:
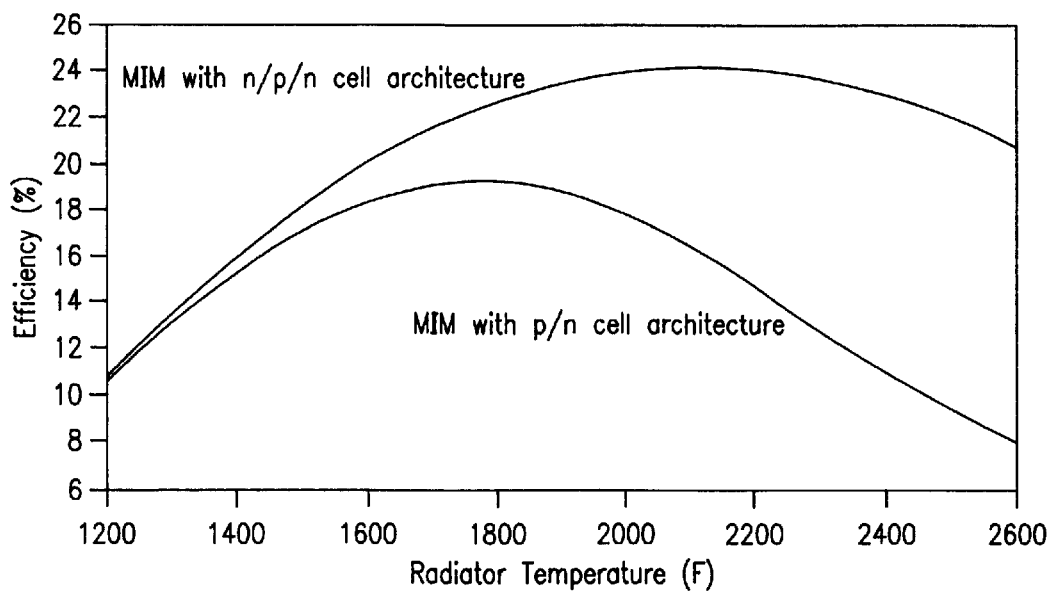
FIG. 7 is a comparison of calculated MIM performance based on measured data for MIMs with and without a buried tunnel junction.
Figure 7B:
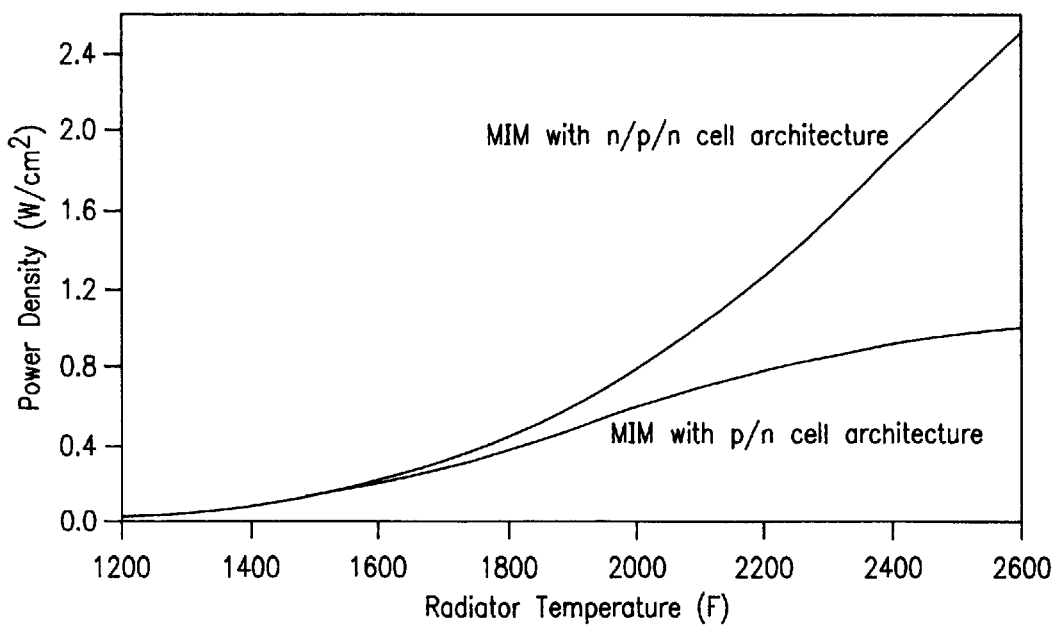

A comparison between calculated efficiency and power density for the best 0.6 eV MIM with a p/n cell architecture and a 0.6 eV MIM with a n/p/n cell architecture (incorporating a buried tunnel junction) is shown in FIGS. 7a and 7b, respectively. The calculation presented in FIGS. 7a and 7b is performed using measured electrical and optical data. The efficiency with the buried tunnel junction is greater than 20% over a wide range of blackbody radiator temperatures (1600° to 2600° F.); whereas the best MIM design to date peaks at 19% at 1800° F. and drops to 8% at 2600° F. as shown in FIG. 7a. Likewise the power density, as shown in FIG. 7b, is considerably higher for the device with the buried tunnel junction compared to the present MIM design.

Having described the currently preferred embodiment of the present invention, it is to be understood that the invention may be otherwise embodied within the scope of the appended claims.

TABLE 1

Summary of Fill Factor and Spectral Utilization Data for 0.74 eV p/n and n/p/n MIMS

| MIM | Trad ° F. | Jsc A/cm$^2$ | FF | Fu | Fu*FF | % Change Relative to 468 |
|---|---|---|---|---|---|---|
| 440 | 1750 | 0.68 | 0.746 | 0.197 | 0.147 | −97% |
|  | 2250 | 2.85 | 0.69 | 0.389 | 0.268 | −85% |
|  | 2500 | 4.65 | 0.63 | 0.472 | 0.297 | −64% |
| 445 | 1750 | 0.68 | 0.731 | 0.232 | 0.17 | −71% |
|  | 2250 | 2.85 | 0.67 | 0.443 | 0.297 | −49% |
|  | 2500 | 4.65 | 0.6 | 0.526 | 0.316 | −54% |
| 408 | 1750 | 0.68 | 0.5 | 0.272 | 0.136 | −13% |
|  | 2250 | 2.85 | — | 0.499 | — |  |
|  | 2500 | 4.65 | — | 0.583 | — |  |
| 510 | 1750 | 0.68 | 0.754 | 0.296 | 0.223 | −30% |
|  | 2250 | 2.85 | 0.744 | 0.508 | 0.378 | −17% |
|  | 2500 | 4.65 | 0.740 | 0.584 | 0.432 | −13% |
| 468 | 1750 | 0.68 | 0.754 | 0.384 | 0.29 | — |
|  | 2250 | 2.85 | 0.744 | 0.596 | 0.443 | — |
|  | 2500 | 4.65 | 0.740 | 0.660 | 0.488 | — |

We claim:

1. A monolithic interconnected module comprising a plurality of series interconnected thermophotovoltaic cells, each cell comprising:
   a substrate, common to and laterally connecting each said cell, having a top surface and a bottom surface;
   a lateral conduction layer, for conducting current laterally, having a top surface and a bottom surface, formed on the top surface of the substrate;
   a tunnel junction having a top surface and a bottom surface, formed on the top surface of the lateral conduction layer; and
   active layers having a top surface and a bottom surface, formed on the top surface of the tunnel junction.

2. A monolithic interconnected module according to claim 1 additionally comprising, in each thermophotovoltaic cell, buffer layers formed between the top surface of the substrate and the bottom surface of the lateral conduction layer, the buffer layers having a top surface and a bottom surface.

3. A monolithic interconnected module according to claim 1 additionally comprising, in each thermophotovoltaic cell, a window layer formed on the top surface of the active layers, the window layer having a top surface and a bottom surface.

4. A monolithic interconnected module according to claim 3 additionally comprising, in each thermophotovoltaic cell, a contact layer formed on the top surface of the window layer, the contact layer having a top surface and a bottom surface.

5. A monolithic interconnected module according to claim 4 additionally comprising, in each thermophotovoltaic cell, top grid fingers formed on the top surface of the contact layer, the top grid fingers being in electrical contact with the top surface of the contact layer; and
   an interconnect forming an electrical connection between the lateral conduction layer of a cell and the top grid fingers of an adjacent cell.

6. A monolithic interconnected module according to claim 5 in which the top grid fingers and interconnect comprise a material selected from the class consisting of alloys and elemental depositions of chromium, titanium, silver and gold.

7. A monolithic interconnected module according to claim 1 additionally comprising, in each thermophotovoltaic cell, a back surface reflector formed on the bottom surface of the substrate.

8. A monolithic interconnected module according to claim 1 wherein the active layers comprise a back surface field of p-type semiconductor material formed on the top surface of the tunnel junction, a base layer of p-type semiconductor material formed on top surface of the back surface field, and an emitter layer of n-type semiconductor material formed on the top surface of the base layer.

9. A monolithic interconnected module according to claim 8 wherein the back-surface field of p-type semiconductor material and the top surface of the tunnel junction comprise a single layer.

10. A monolithic interconnected module according to claim 8, in which the lateral conduction layer comprises an n-type material.

11. A monolithic interconnected module according to claim 1 additionally comprising graded layers of undoped semiconductor material disposed between the top surface of the substrate and the bottom surface of the lateral conduction layer, the graded layers having a top surface and a bottom surface.

12. A monolithic interconnected module according to claim 1 wherein the tunnel junction comprises two layers, a layer of heavily doped n-type semiconductor material formed on the top surface of the lateral conduction layer and a layer of heavily doped p-type semiconductor material formed on the top surface of the heavily doped n-type semiconductor material.

13. A monolithic interconnected module according to claim 1 further comprising a stop etch layer interposed between the bottom surface of the tunnel junction and the top surface of the lateral conduction layer, the stop etch layer having a top surface and a bottom surface.

14. A monolithic interconnected module according to claim 1 in which each series interconnected cell is comprised of a plurality of parallel interconnected subcells sharing a lateral conduction layer.

15. A monolithic interconnected module according to claim 14 additionally comprising a plurality of grid fingers forming electrical connections between the top surface of a cell and the lateral conduction layer of an adjacent cell.

16. A monolithic interconnected module according to claim 15 additionally comprising at least one dielectric electrically isolating the grid fingers from the lateral conduction layers of a cell and isolating the interconnect from the exposed active and conducting layers of a cell.

17. A monolithic interconnected module according to claim 16 in which the dielectric layer comprises a material selected from the group consisting of spin-on glass, silicon nitride, $Ta_2O_5$, any ceramic that can be sputtered and any ceramic that can be e-beamed.

18. A monolithic interconnected module according to claim 1 in which the lateral conduction layer comprises an n-type material.

19. A monolithic interconnected module according to claim 1 in which the substrate comprises a material selected from the group consisting of InP, GaAs, InSb, InAs, Si, Ge and GaSb.

20. A monolithic interconnected module according to claim 1 in which the lateral conduction layer, tunnel junction and active layers comprise materials selected from the group consisting of $In_xGa_{1-x}P_yAs_{1-y}$ and $In_xGa_{1-x}As_ySb_{1-y}$ where $0 \leq x \leq 1$ and $0 \leq y \leq 1$.

21. A monolithic interconnected module according to claim 1, in which said substrate comprises a semi-insulating material.

* * * * *